United States Patent [19]

Lee

[11] Patent Number: 5,066,606
[45] Date of Patent: Nov. 19, 1991

[54] IMPLANT METHOD FOR ADVANCED STACKED CAPACITORS

[75] Inventor: Ruojia Lee, Boise, Id.

[73] Assignee: Micron Technology, Inc., Boise, Id.

[21] Appl. No.: 624,166

[22] Filed: Dec. 7, 1990

[51] Int. Cl.[5] ............................................. H01L 21/70
[52] U.S. Cl. ........................................ 437/52; 437/46; 437/47; 437/60; 437/191; 437/919
[58] Field of Search ..................... 437/34, 40, 41, 44, 437/46, 47, 51, 52, 60, 228, 233, 235, 186, 191, 919; 357/23.6

[56] References Cited

U.S. PATENT DOCUMENTS 4,935,380  6/1990  Okumura ........................... 437/44
4,992,389  2/1991  Ogura et al. ....................... 437/44

Primary Examiner—Brian E. Hearn
Assistant Examiner—Tom Thomas
Attorney, Agent, or Firm—David J. Paul

[57] ABSTRACT

An implant method to develop a storage node access MOSFET to a 3-dimensional stacked capacitor storage cell during a semiconductor fabrication process. This implant method utilizes one layer of oxide to serve as both a MOSFET's (N-channel or P-channel) lightly doped drain spacer as well as a subsequent polysilicon etch stopper when etching a FET's digitline. As DRAM density increases the use of only one oxide layer decreases oxide bridging or buildup.

20 Claims, 2 Drawing Sheets

IMPLANT METHOD FOR ADVANCED STACKED CAPACITORS

FIELD OF THE INVENTION

This invention relates to semiconductor circuit memory storage devices and more particularly to an implant doping method for three-dimensional stacked cell capacitors used in high-density dynamic random access memory (DRAM) arrays.

BACKGROUND OF THE INVENTION

A method of maintaining, as well as increasing, storage node size in densely packed memory devices is through the use of "stacked storage cell" design. With this technology, layers of a conductive material such as polycrystalline silicon (polysilicon or poly) are deposited over an access device on a silicon wafer with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with inter-plate insulative layers having a high dielectric constant.

Conventionally, DRAMs having three-dimensional stacked capacitor cells use metal oxide semiconductor field effect transistor (MOSFET) as a storage node access transistor and are processed in such a way that the transistor's source/drain diffusion regions are doped via a heavily implant prior to the formation of digitlines. If the digitlines are polysilicon or polycided materials then usually the formation of digitlines are formed after the channel transistor source/drain diffusion implant but before storage poly and cell-plate poly formation. On the other hand, if the digitlines are metal such as aluminum material, the digitlines are normally formed after storage poly and cell-plate poly formations.

As DRAM density increases (16MBit and beyond) the minimum feature size spacing will make it difficult to handle many isotropic oxide depositions without suffering from oxide buildup or oxide gap bridging problems. For example, in 16MBit stacked capacitor DRAMs, an access N-channel transistor gate wordline spacing for poly digitline buried contact is usually around the minimum feature size. The spacing has to handle at least two major isotropic silicon oxide (usually TEOS) deposition steps: one oxide layer for an N-channel LDD (lightly doped drain) spacer; and another oxide layer to serve as a digitline poly etch stopper. These two oxide depositions are a must for conventional high density stacked capacitor DRAMs with LDD due to the fact that the N-channel source/drain diffusion heavy arsenic implant is carried out prior to the formation of next poly step.

The present invention develops a method of an existing stacked capacitor fabrication process that uses only one oxide layer to serve as an N-channel LDD spacer as well as a subsequent poly etch stopper.

SUMMARY OF THE INVENTION

The invention is directed to a method of doping the source/drain diffusion region of a storage node access MOSFET via a heavy implant in a conventional stacked capacitor fabrication process used in a developing high density/high volume DRAMs (dynamic random access memories).

The present invention develops a method of an existing stacked capacitor fabrication process that uses only one oxide layer to serve as an N-channel LDD spacer as well as a subsequent poly etch stopper. This concept allows a heavy source/drain diffusion implant to take place after patterning and etching of digitlines. By using only one oxide layer conventional oxide buildup and gap bridging are greatly reduced.

The invention provides a method to effectively dope source/drain diffusion regions of storage node access MOSFETs within a DRAM array as geometries are dramatically shrunk.

DETAILED DESCRIPTION OF THE PREFERRED EMBODIMENT

The invention is directed to a method of doping source/drain diffusion regions of a MOSFET (used as an access transistor), and more particularly to an N-channel transistor, used in a conventional stacked capacitor fabrication process for developing high density/high volume DRAMs, in a sequence shown in FIGS. 1–4.

A silicon wafer is prepared using conventional process steps up to the point of implanting source/drain diffusion regions of an access transistor following formation of wordlines in a DRAM cell array. Source/drain diffusion implanting of an N-channel access transistor will now follow.

While MOSFET transistors in DRAM arrays are described, the inventive features are useful in a wide variety of semiconductor applications. For example, the MOSFET can be used as a diode or as a potential limiting device, according to design choice. Therefore, MOSFET is intended to a class of semiconductor devices constructed with a gate, in the manner of a MOSFET transistor.

Figure 1:
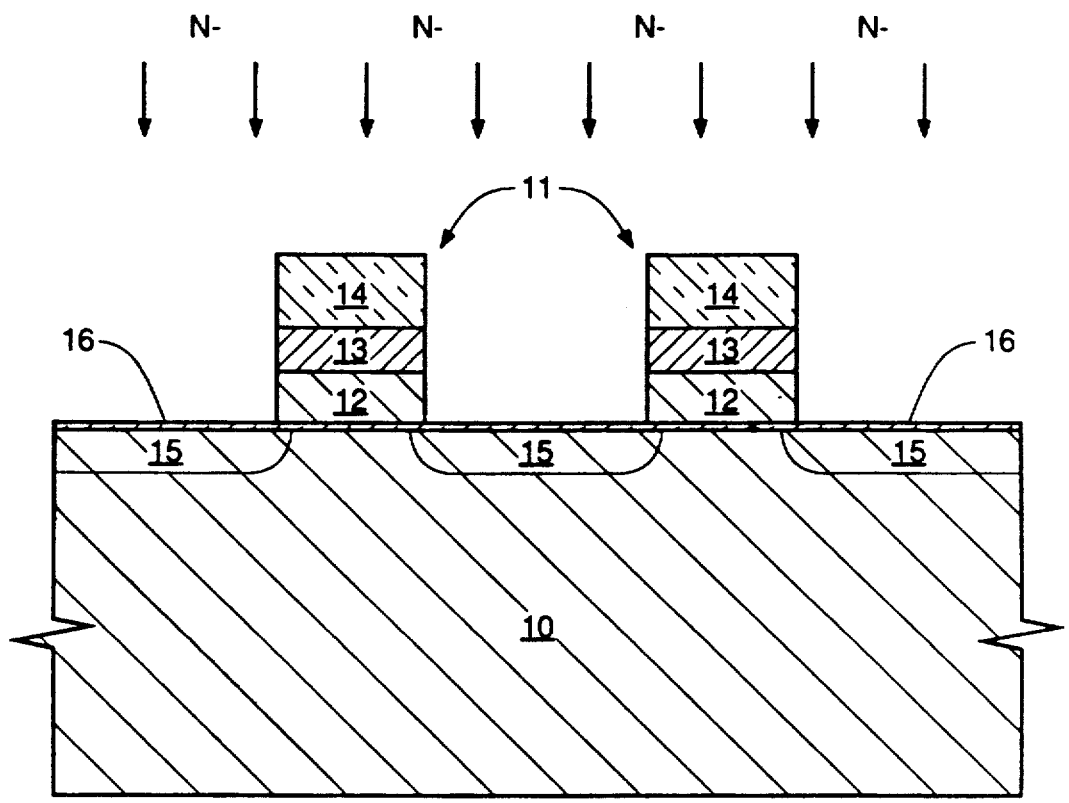
FIG. 1 is a cross-sectional view of an in-process wafer after wordline formation followed by a light phosphorus implant.

As shown in FIG. 1, parallel wordlines 11 are made up of patterned and etched layers of poly 12, silicide 13 (such as tungsten silicide) and oxide 14 on a silicon wafer. Wordlines 11 are separated from the wafer's bulk silicon 10 by a layer of oxide 16. Lightly doped source/drain diffusion regions 15 are formed in silicon 10 after an implant from a lightly doped source. Source/drain diffusion regions 15 can be doped to a first conductivity type possessing n-type conductivity via a source such as N− phosphorus.

Figure 2:
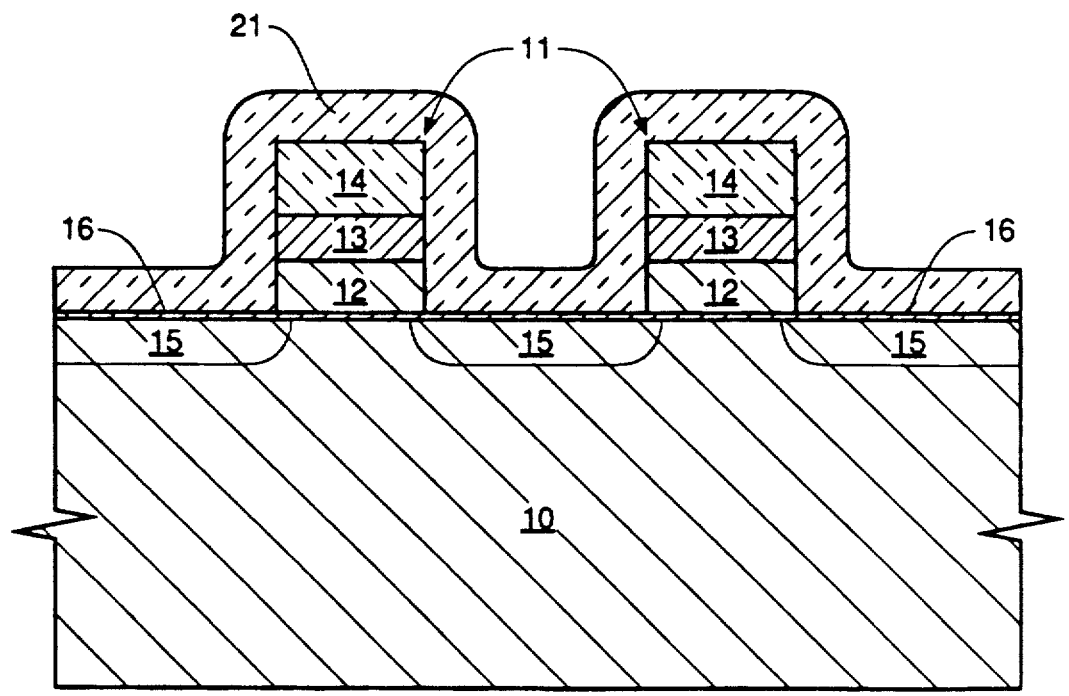
FIG. 2 is a cross-sectional view of the in-process wafer portion of FIG. 1 following deposition of a conformal layer of oxide.

As shown in FIG. 2, a conformal layer of oxide 21 is deposited, preferably by TEOS deposition, over the topology resulting from formation of wordlines 11. Now the wafer is ready for digitline formation that will run perpendicular to wordlines 11.

Figure 3:
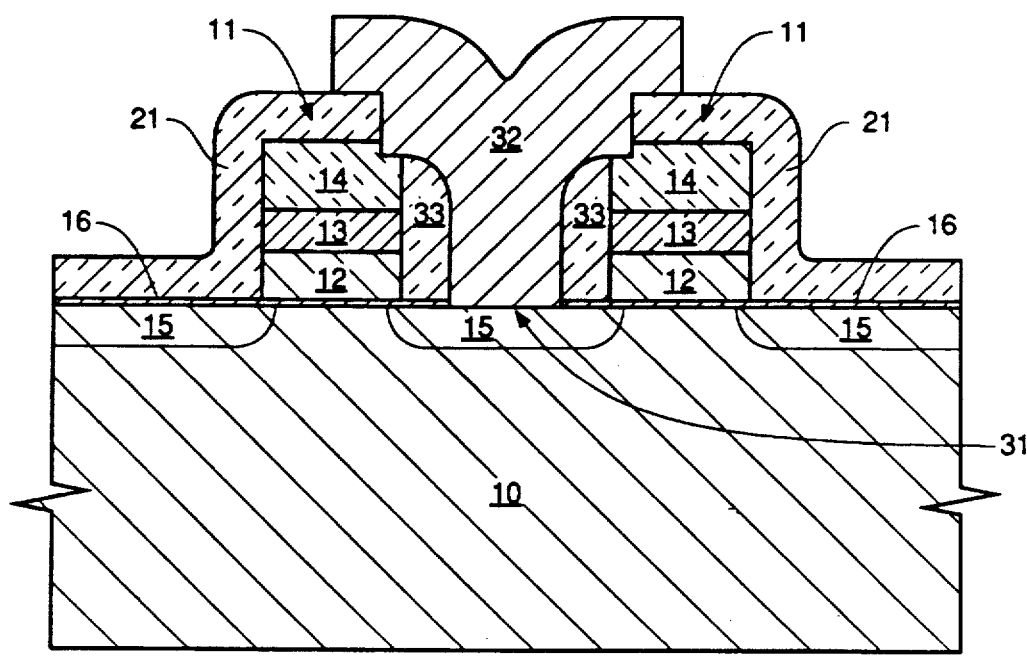
FIG. 3 is a cross-sectional view of the in-process wafer portion of FIG. 2 after etching a buried contact opening, a blanket deposition of conformal poly and digitline patterning, respectively.

First, as shown in FIG. 3, a self aligned buried contact 31 is opened by etching away a portion of oxide 21 to form vertical oxide spacers 33. The etch is then followed by deposition of a conformal layer of poly 32. Poly 32 is patterned and etched to form a digitline 32 running over the top and perpendicular to wordlines 11.

Figure 4:
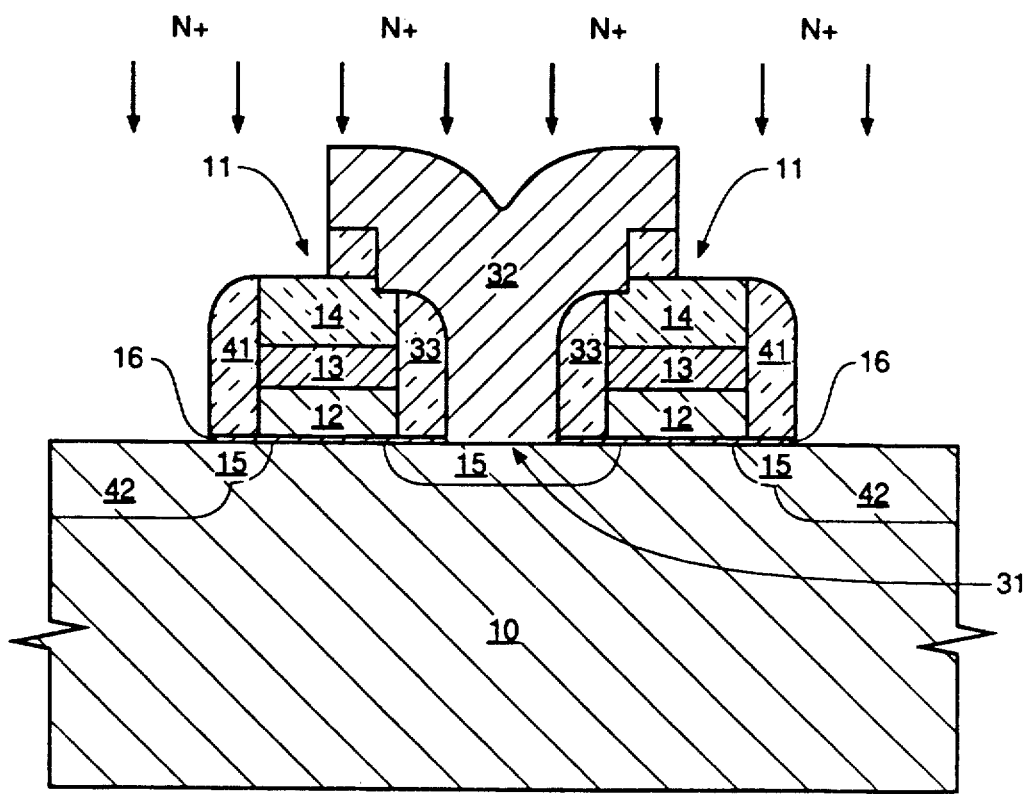
FIG. 4 is a cross-sectional view of the in-process wafer portion of FIG. 3 following an oxide anisotropic etch and an N-channel source/drain diffusion arsenic implant.

As shown in FIG. 4, an oxide anisotropic etch forms additional vertical oxide spacers 41. Oxide spacers 41 and 33 combine with wordline oxide 14 to serve as an implant blocking layer to a heavy implant step that follows. Heavily doped source/drain diffusion regions 42 are formed in previously lightly doped source/drain diffusion regions 15 following an implant from a heavily doped source such as N+ arsenic. Lightly doped regions 15 and heavily doped regions 42 combine to serve as source/drain diffusion regions of an access MOSFET for a stacked capacitor storage cell.

It is to be understood that although the present invention has been described with reference to a preferred embodiment of implanting N-channel MOSFETs of a first conductivity type, the same technique can be used to implant P-channel MOSFETs being a second conductivity type as well, by applying the appropriate implanting sources. For example, P— boron could be used as a lightly doped implant source and P+ boron, such as boron diflouride (BF$_2$) could be used as a heavily doped implant source. Other modifications, known to those skilled in the art, may be made to the structures and process steps presented herein without departing from the invention as recited in the several claims appended hereto.

I claim:

1. A process for developing source/drain diffusion regions of an MOSFET during fabrication of a semiconductor on a silicon substrate, said process steps comprising:
   a) depositing a first dielectric layer superjacent surface of said silicon substrate;
   b) depositing a first conductive layer superjacent surface of said first dielectric;
   c) depositing a second dielectric layer superjacent said first conductive layer;
   d) masking and etching said first conductive and said second dielectric layers to form a first control line;
   e) implanting a lightly doped impurity into said silicon substrate, thereby forming said source/drain diffusion regions on opposite sides of said control line;
   f) said step of implanting a lightly doped impurity causing said control line to bridge said source/drain diffusion regions, thereby forming a gate isolated from said silicon substrate by said first dielectric layer, said gate bridging a pair of said source/drain diffusion regions to form said MOSFET;
   g) depositing a third dielectric layer superjacent existing topology of surface of said semiconductor;
   h) creating an aligned d buried contact location thereby providing a second control line junction at a first source/drain diffusion region of said MOSFET;
   i) depositing a second conductive layer superjacent said semiconductor surface, said second conductive layer making direct contact to said second control line junction at said buried contact location;
   j) masking and etching said second conductive layer to form a conductive second control line;
   k) anisotropically etching said third dielectric layer; and
   l) implanting a heavily doped impurity into said source/drain diffusion regions of said MOSFET, said implanting taking place at regions not covered by an implant blocking remnant of said second dielectric.

2. A process as recited in claim 1, wherein said first, said second and said third dielectric layers include oxide.

3. A process as recited in claim 1, wherein said first conductive layer comprises a layer of tungsten silicide and metal.

4. A process as recited in claim 1, wherein said buried contact is self aligned.

5. A process as recited in claim 1, wherein said second conductive layer is doped polysilicon.

6. A process as recited in claim 1, wherein said implanting a lightly doped impurity is from an N— phosphorus source and a heavily doped impurity is from an N+ arsenic source.

7. A process as recited in claim 1, wherein said implanting a lightly doped impurity is from an P— boron source and a heavily doped impurity is from an P+ boron diflouride source.

8. A process as recited in claim 1, wherein said MOSET is N-channel.

9. A process as recited in claim 1, wherein said MOSFET is P-channel.

10. A process for developing source/drain diffusion regions of storage node MOSFET during fabrication of a DRAM array on a silicon substrate, said process steps comprising:
   a) depositing a first dielectric layer superjacent surface of said array;
   b) depositing a first conductive layer superjacent surface of said array;
   c) depositing a second dielectric layer superjacent said first conductive layer;
   d) masking and etching said first conductive and said second dielectric layers to form a plurality of parallel conductive wordlines arranged in rows, said wordlines being separated from said silicon substrate by said first dielectric layer;
   e) implanting a lightly doped impurity into said silicon substrate, thereby forming said source/drain diffusion regions on opposite sides of each said wordline;
   f) said step of implanting a lightly doped impurity causing said wordlines to bridge said source/drain diffusion regions, thereby forming a gate isolated from said silicon substrate by said first dielectric layer, said gate bridging a pair of said source/drain diffusion regions to form said MOSFET;
   g) depositing a third dielectric layer superjacent said array surface;
   h) creating an aligned buried contact location thereby providing a digitline junction at a first source/drain diffusion region of each said MOSFET;
   i) depositing a second conductive layer superjacent said array surface, said second conductive layer making direct contact to said digitline junctions at said buried contact locations;
   j) masking and etching said second conductive layer to form a plurality of parallel conductive digitlines arranged in columns such that a digitline maintains electrical contact at each said digitline junction within a said column, said digitlines running perpendicular to and over said wordlines forming a 3-dimensional, waveform-like topology;

k) anisotropically etching said third dielectric layer; and l) implanting a heavily doped impurity into said source/drain diffusion regions of each said MOSFET, said implanting taking place in regions not covered by an implant blocking remnant of said second dielectric.

11. A process as recited in claim 10, wherein said first, said second and said third dielectric layers include oxide.

12. A process as recited in claim 10, wherein said first conductive layer comprises a layer of tungsten silicide and metal.

13. A process as recited in claim 10, wherein said buried contact is self aligned.

14. A process as recited in claim 10, wherein said second conductive layer is doped polysilicon.

15. A process as recited in claim 10, wherein said implanting a lightly doped impurity is from an N− phosphorus source and a heavily doped impurity is from an N+ arsenic source.

16. A process as recited in claim 10, wherein said implanting a lightly doped impurity is from an P− boron source and a heavily doped impurity is from an P+ boron diflouride source.

17. A process as recited in claim 10, wherein said MOSET is N-channel.

18. A process as recited in claim 10, wherein said MOSFET is P-channel.

19. A process for developing source/drain diffusion regions of storage node access N-channel MOSFET during fabrication of a DRAM array on a silicon substrate, said process steps comprising:

a) depositing a first oxide layer superjacent surface of said array;

b) depositing a first conductive layer superjacent surface of said array, said conductive layer includes n-type doped polysilicon and tungsten silicide;

c) depositing a second oxide layer superjacent said first conductive layer;

d) masking and etching said first conductive and said second oxide layers to form a plurality of parallel conductive wordlines arranged in rows, said wordlines being separated from said silicon substrate by said first oxide layer;

e) implanting a N− impurity into said silicon substrate, thereby forming lightly doped said source/drain diffusion regions on opposite sides of each said wordline;

f) said step of implanting said N− impurity causing said wordlines to bridge said source/drain diffusion regions, thereby forming a gate isolated from said silicon substrate by said first dielectric layer, said gate bridging a pair of said source/drain diffusion regions to form said N-channel MOSFET;

g) depositing a third oxide layer superjacent said array surface;

h) creating a self aligned buried contact location thereby providing a digitline junction at a first source/drain diffusion region of each said MOSFET;

i) depositing a polsilicon layer superjacent said array surface, said polysilicon being doped as n-type conductivity and making direct contact to said digitline junctions at said buried contact locations;

j) masking and etching said polysilicon layer to form a plurality of parallel conductive digitlines arranged in columns such that a digitline maintains electrical contact at each s id digitline junction within a said column, said digitlines running perpendicular to and over said wordlines forming a 3-dimensional, waveform-like topology;

k) anisotropically etching said third oxide layer; and l) implanting an N+ impurity into said source/drain diffusion regions of each said lightly doped N-channel MOSFET, said implanting taking place in regions not covered by an implant blocking remnant of said second dielectric.

20. A process for developing source/drain diffusion regions of storage node access P-channel MOSFET during fabrication of a DRAM array on a silicon substrate, said process steps comprising:

a) depositing a first oxide layer superjacent surface of said array;

b) depositing a first conductive layer superjacent surface of said array, said conductive layer includes p-type doped polysilicon and tungsten silicide;

c) depositing a second oxide layer superjacent said first conductive layer;

d) masking and etching said first conductive and said second oxide layers to form a plurality of parallel conductive wordlines arranged in rows, said wordlines being separated from said silicon substrate by said first oxide layer;

e) implanting a P− impurity into said silicon substrate, thereby forming lightly doped said source/drain diffusion regions on opposite sides of each said wordline;

f) said step of implanting said P− impurity causing said wordlines to bridge said source/drain diffusion regions, thereby forming a gate isolated from said silicon substrate by said first dielectric layer, said gate bridging a pair of said source/drain diffusion regions to form said P-channel MOSFET;

g) depositing a third oxide layer superjacent said array surface;

h) creating a self aligned buried contact location thereby providing a digitline junction at a first source/drain diffusion region of each said MOSFET;

i) depositing a polysilicon layer superjacent said array surface, said polysilicon being doped as p-type conductivity and making direct contact to said digitline junctions at said buried contact locations;

j) masking and etching said polysilicon layer to form a plurality of parallel conductive digitlines arranged in columns such that a digitline maintains electrical contact at each said digitline junction within a said column, said digitlines running perpendicular to and over said wordlines forming a 3-dimensional, waveform-like topology;

k) anisotropically etching said third oxide layer; and l) implanting an P+ impurity into said source/drain diffusion regions of each said lightly doped P-channel MOSFET, said implanting taking place in regions not covered by an implant blocking remnant of said second dielectric.

* * * * *

UNITED STATES PATENT AND TRADEMARK OFFICE
CERTIFICATE OF CORRECTION

PATENT NO. : 5,066,606

DATED : November 19, 1991

INVENTOR(S) : Ruojia Lee

It is certified that error appears in the above-indentified patent and that said Letters Patent is hereby corrected as shown below:

Column 3, line 56, after "aligned," please delete "d".

Column 6, line 6, delete "s id" and insert -- said --.

Signed and Sealed this

Twenty-fifth Day of January, 1994

Attest:

BRUCE LEHMAN

*Attesting Officer*  *Commissioner of Patents and Trademarks*